United States Patent
Jeong et al.

(10) Patent No.: US 10,437,306 B2
(45) Date of Patent: Oct. 8, 2019

(54) MEMORY CONTROLLER AND MEMORY SYSTEM HAVING THE SAME

(71) Applicant: SK hynix Inc., Gyeonggi-do (KR)

(72) Inventors: Jae Hyeong Jeong, Seoul (KR); Kwang Hyun Kim, Gyeonggi-do (KR); Jae Woo Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 434 days.

(21) Appl. No.: 14/993,708

(22) Filed: Jan. 12, 2016

(65) Prior Publication Data

US 2017/0060452 A1   Mar. 2, 2017

(30) Foreign Application Priority Data

Sep. 2, 2015   (KR) .................. 10-2015-0124343

(51) Int. Cl.
| | |
|---|---|
| *G06F 13/16* | (2006.01) |
| *G06F 1/32* | (2019.01) |
| *G11C 16/30* | (2006.01) |
| *G11C 16/32* | (2006.01) |
| *G06F 1/3234* | (2019.01) |
| *G11C 5/14* | (2006.01) |
| *G11C 7/22* | (2006.01) |
| *G11C 29/04* | (2006.01) |

(52) U.S. Cl.
CPC .............. *G06F 1/32* (2013.01); *G06F 1/3275* (2013.01); *G06F 13/1668* (2013.01); *G11C 16/30* (2013.01); *G11C 16/32* (2013.01); *G11C 5/14* (2013.01); *G11C 7/22* (2013.01); *G11C 2029/0411* (2013.01); *Y02D 10/14* (2018.01)

(58) Field of Classification Search
None
See application file for complete search history.

(56) References Cited

U.S. PATENT DOCUMENTS

| | | | | |
|---|---|---|---|---|
| 8,572,423 | B1 * | 10/2013 | Isachar | G06F 1/3225 365/244 |
| 8,854,900 | B2 | 10/2014 | Lee et al. | |
| 9,444,260 | B2 * | 9/2016 | Cobb | H02J 4/00 |
| 2009/0070607 | A1 * | 3/2009 | Safford | G06F 1/3234 713/320 |
| 2010/0036998 | A1 * | 2/2010 | Ben-Rubi | G06F 3/0625 711/100 |
| 2012/0331207 | A1 * | 12/2012 | Lassa | G06F 1/3278 711/103 |
| 2012/0331282 | A1 * | 12/2012 | Yurzola | G06F 1/3275 713/100 |
| 2013/0124888 | A1 * | 5/2013 | Tanaka | G11C 16/06 713/320 |

(Continued)

FOREIGN PATENT DOCUMENTS

KR   1020130002045   1/2013

*Primary Examiner* — Charles Rones
*Assistant Examiner* — Hewy H Li
(74) *Attorney, Agent, or Firm* — IP & T Group LLP (57) ABSTRACT

A memory controller includes a current information storage unit storing information about various current amounts of a memory system, a current management unit controlling an output time of an operation execution signal by calculating the information about the various current amounts, and a command controller outputting a command to operate a memory device in response to the operation execution signal.

22 Claims, 7 Drawing Sheets

(56) References Cited

U.S. PATENT DOCUMENTS

| | | | |
|---|---|---|---|
| 2014/0253189 A1* | 9/2014 | Sadowski | G06F 1/32 327/141 |
| 2015/0185799 A1* | 7/2015 | Robles | G06F 1/32 713/320 |
| 2015/0199999 A1* | 7/2015 | Sommer | G11C 5/14 365/226 |
| 2015/0309752 A1* | 10/2015 | Ellis | G06F 3/0625 711/103 |
| 2016/0077961 A1* | 3/2016 | Erez | G06F 3/0625 711/103 |
| 2016/0231957 A1* | 8/2016 | Erez | G06F 3/0625 |

* cited by examiner

MEMORY CONTROLLER AND MEMORY SYSTEM HAVING THE SAME

CROSS-REFERENCE TO RELATED APPLICATION

The present application claims priority to Korean patent application number 10-2015-0124343, filed on Sep. 2, 2015, the entire disclosure of which is herein incorporated by reference in its entirety.

BACKGROUND

Field of Invention

Various exemplary embodiments relate generally to memory devices, and more particularly to a memory controller for a memory system and a method of operation thereof capable of managing current utilization to prevent malfunctioning.

Description of Related Art

A memory system may include a memory device for storing data and a memory controller for controlling the memory device.

The memory controller may control the general operations of the memory device and data exchange between a host and the memory device.

The host may communicate with the memory system by using an interface protocol, such as a peripheral component interconnect-Express (PCI-E), advanced technology attachment (ATA), serial ATA (SATA), parallel ATA (PATA), and serial attached SCSI (SAC).

The memory controller may control a plurality of storage devices included in the memory device at the same time in response to a host command provided from the host. Multiple storage devices may perform operations concurrently, however, if the current consumption of the memory system increases too rapidly it may cause the storage devices to perform erroneous operations due to a temporary shortage of current. As a result, reliability of the memory system may be deteriorated.

SUMMARY

Various embodiments are directed to a memory controller capable of controlling a memory device according to the amount of electric current consumed by a memory system, and the memory system having the same.

According to an embodiment, a memory controller may include a current information storage unit storing information about various current amounts of a memory system, a current management unit controlling an output time of an operation execution signal by calculating the information about the various current amounts, and a command controller outputting a command to operate a memory device in response to the operation execution signal.

A memory controller according to an embodiment may include a command controller outputting an operation type signal and an operation state check signal in response to a host command received from a host, and a current management unit transferring the operation type signal to a current information storage unit in response to the operation state check signal, and outputting an operation execution signal to the command controller by calculating a current amount according to information received from the current information storage unit, wherein the current information storage unit stores information about various current amounts and outputs the information about the current amount in response to the operation type signal received from the current management unit.

A memory system according to an embodiment may include a memory device configured to store data therein, and a memory controller controlling an output time of a second command to control the memory device in response to a first command received from a host, wherein the memory controller controls an output time of the second command by calculating information about an expected current amount, information about an allowable current amount and information about an available current amount corresponding to various operations.

DETAILED DESCRIPTION

Various embodiments will now be described with reference to the accompanying drawings. The present invention may, however, be embodied in different forms and should not be construed as limited to the embodiments set forth herein. Rather, these embodiments are provided so that this disclosure will be thorough and complete. Moreover, in the drawings, thicknesses and lengths of components may be exaggerated for convenience of illustration. Also, for simplicity, like reference numerals refer to like elements throughout the specification and drawings.

Figure 1:
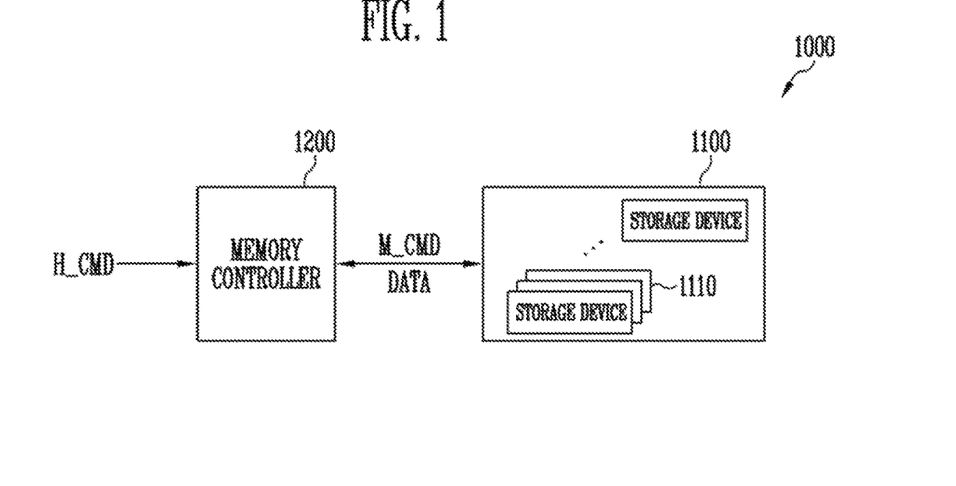
FIG. 1 illustrates a memory system, according to an embodiment of the invention.

FIG. 1 illustrates a memory system, according to an embodiment of the invention.

Referring to FIG. 1, the memory system 1000 may include a memory device 1100 and a memory controller 1200.

The memory device 1100 may include a plurality of storage devices 1110. The storage devices 1110 be semiconductor based memory devices. The storage devices may be nonvolatile memory devices. The storage devices may be volatile memory devices. Examples of suitable storage devices may include Double Data Rate Synchronous Dynamic Random Access Memory (DDR SDRAM), Low Power Double Data Rate4 (LPDDR4) SDRAM, Graphics Double Data Rate (GDDR) SDRAM, Low Power DDR (LPDDR), Rambus Dynamic Random Access Memory (RDRAM), Resistance Random Access Memory (ReRAM), Spin Torque Transfer Magnetic Random Access Memory (STTMRAM), Phase-Change Random Access Memory (PCRAM), or FLASH Memory.

The memory controller 1200 may control the general operations of the memory device 1100. The memory controller 1200 may apply a memory command M_CMD and data DATA to the memory device 1100 in response to a host command H_CMD from a host (not illustrated), or may receive the data DATA from the memory device 1100.

Though not shown in FIG. 1, the host may communicate with the memory system 1000 by using an interface protocol. Any suitable interface protocol may be used, such as Peripheral Component Interconnect-Express (PCI-E), Advanced Technology Attachment (ATA), Serial ATA (SATA), Parallel ATA (PATA), serial attached SCSI (SAS) and the like.

Each storage device 1110 may perform one or more operations. For example each storage device may perform a program operation, a read operation, an erase operation and or any combinations thereof, in response to a memory command M_CMD and data DATA provided from the memory controller 1200. One or more of the plurality of the storage devices may be operated at the same time.

The memory controller 1200 may control the memory device 1100 of the memory system 1000 to ensure that the overall current consumption by the storage devices does not exceed the available current thus preventing erroneous operations by the storage devices due to lack of current.

Figure 2:
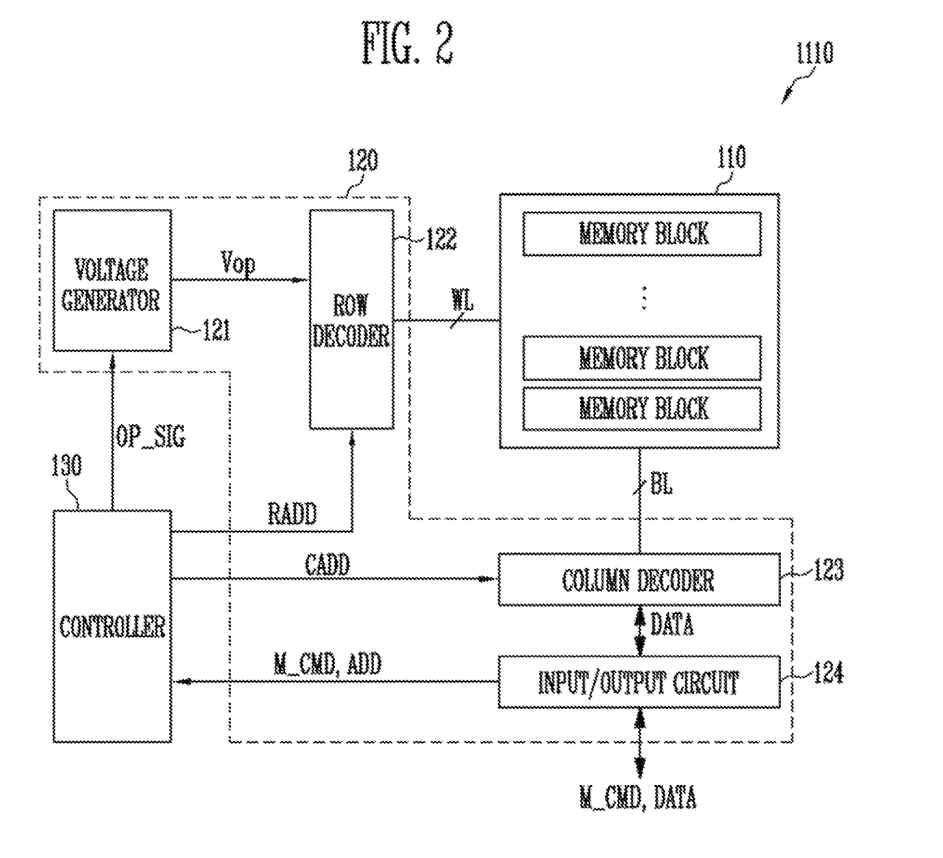
FIG. 2 illustrates an example of a storage device shown in FIG. 1.

FIG. 2 illustrates an example of a storage device 1110 that may be employed in a memory device 1100 as shown in FIG. 1.

Referring to FIG. 2, the storage device 1110 may be a flash memory. However, it is noted that the invention is not limited to flash memory storage devices only and any other suitable storage devices may be used. The storage device 1110 may include a memory cell array 110 for storing data therein, peripheral circuits generally designated with numeral 120 and a controller 130 for controlling the peripheral circuits 120. The peripheral circuits 120 may be configured to program data into the memory cell array 110, read stored data, erase data and or perform any combinations thereof.

The memory cell array 110 may include a plurality of memory blocks. Word lines WL and bit lines BL may be coupled to each of the memory blocks. The word lines WL may be coupled to each of the memory blocks, and the bit lines BL may be coupled in common to the memory blocks. The memory blocks may include two-dimensionally or three-dimensionally structured cell strings. The cell strings may include a plurality of memory cells. In two-dimensional cell strings, memory cells may be arranged in parallel with a substrate. In three-dimensional cell strings, memory cells may be stacked in a vertical direction to the substrate.

The peripheral circuits 120 may include a voltage generator 121, a row decoder 122, a column decoder 123 and an input/output circuit 124.

The voltage generator 121 may generate operating voltages Vop having various voltage levels to perform program, read and erase operations in response to an operating signal OP_SIG. For example, the voltage generator 121 may generate a program voltage, a read voltage, an erase voltage, a verify voltage and a pass voltage as the operating voltages Vop.

The row decoder 122 may transfer the operating voltages Vop to the word lines WL coupled to a selected memory block in response to a row address RADD.

The column decoder 123 may exchange data with the selected memory block through the bit lines BL in response to a column address CADD.

The input/output circuit 124 may receive the memory command M_CMD and the data DATA as well as an address ADD from the memory controller 1200, transfer the memory command M_CMD and the address ADD to the controller 130, and exchange the data DATA with the column decoder 123. The address ADD may be included in the data DATA which the input/output circuit 124 receives.

The controller 130 may control the peripheral circuits 120 by outputting the operating signal OP_SIG, the row address RADD and the column address CADD in response to the memory command M_CMD and the address ADD.

Figure 3:
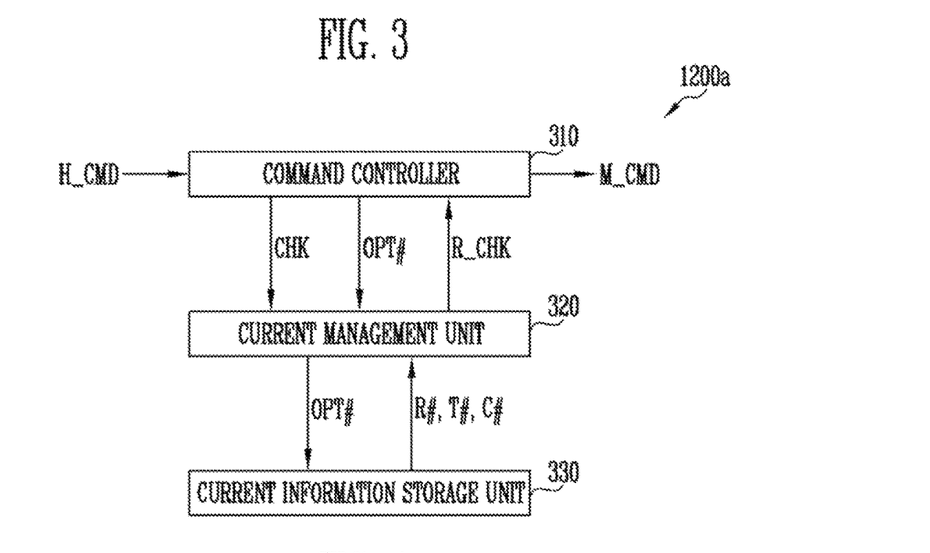
FIG. 3 illustrates a memory controller, according to an embodiment of the invention.

FIG. 3 illustrates a memory controller 1200a, according to an embodiment of the invention. The memory controller 1200a may be employed with the memory system 1000 of FIG. 1.

Referring to FIG. 3, the memory controller 1200a may include a command controller 310, a current management unit 320 and a current information storage unit 330.

The command controller 310 may determine whether or not an operation to be performed in response to a host command H_CMD requires current consumption by the storage device 1110. According to the result of this determination, the command controller 310 may output the memory command M_CMD, or may output an operation state check signal CHK and an operation type signal OPT# to adjust an output timing of the memory command M_CMD.

For example, when the command controller 310 determines that the host command H_CMD does not lead to current consumption by the storage device 1110, the command controller 310 may output the memory command M_CMD so that the selected storage device 1110 may perform an operation for the host command H_CMD.

When the command controller 310 determines that the host command H_CMD leads to current consumption by the storage device 1110, the command controller 310 may output an operation state check signal CHK and an operation type signal OPT# to the current management unit 320, and may output the memory command M_CMD in response to an operation execution signal R_CHK provided from the current management unit 320.

The current management unit 320 may transfer the operation type signal OPT# from the command controller 310 to the current information storage unit 330 in response to the operation state check signal CHK, and may output the operation execution signal R_CHK according to stability of current consumption. For determination of the stability of current consumption, the current management unit 320 may receive information about an expected current amount R#, an allowable current amount T# and a currently-consumed current amount C# output from the current information storage unit 330. For example, the current management unit 320 may receive the information about the expected current amount R#, the allowable current amount T# and the currently-consumed current amount C#, and may output the operation execution signal R_CHK through determination of the stability of current consumption. The expected current amount R# may be the amount of electric current consumed by the storage device 1110 to perform the operation for the host command H_CMD. The allowable current amount T# may be the maximum amount of electric current for the memory system 1000 by which the memory device 1110 may perform operations without failure. The currently-consumed current amount C# may be the amount of electric current, which is currently consumed by the memory system 1000.

For example, when the expected current amount R# is less than an available current amount, which is the allowable current amount T# minus the currently-consumed current amount C#, the current management unit 320 may determine that the current consumption of the memory system 1000 is stable despite of the expected current consumption by the operation of the storage device 1110 for the host command H-CMD and thus output the operation execution signal R_CHK. When the expected current amount R# is greater than the available current amount, the current management unit 320 may determine that the current consumption of the memory system 1000 is going to be unstable due to the expected current consumption by the operation of the storage device 1110 for the host command H-CMD and thus delay the output of the operation execution signal R_CHK as much as delay time of the storage device 1110.

The current information storage unit 330 may provide information about amounts of electric current for various operations in response to corresponding host commands H_CMD. For example, the current information storage unit 330 may include storage units storing information about a current amount and provide the information about the current amount to the current management unit 320. For example, the current information storage unit 330 may include the storage units in which information about the expected current amount R#, the allowable current amount T#, and the currently-consumed current amount C# are stored, respectively. The current information storage unit 330 may provide the current management unit 320 with the information about the expected current amount R#, the allowable current amount T# and the currently-consumed current amount C# according to the operation type signal OPT#.

The command controller 310, the current management unit 320 and the current information storage unit 330 are described below in more detail.

Figure 4:
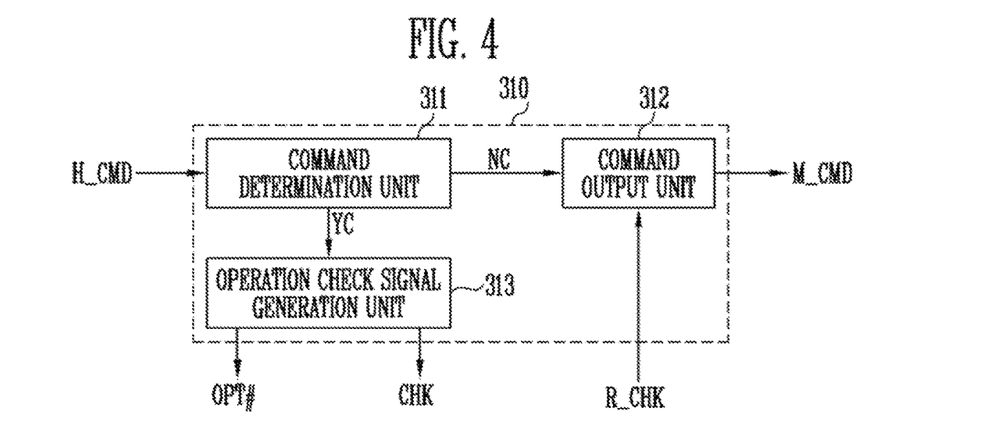
FIG. 4 illustrates an example of a command controller shown in FIG. 3.

FIG. 4 illustrates the command controller 310 shown in FIG. 3.

Referring to FIG. 4, the command controller 310 may include a command determination unit 311, a command output unit 312 and an operation check signal generation unit 313.

The command determination unit 311 may receive the host command H_CMD from the host and output an advance signal NC or a check signal YC by determining whether the host command H_CMD leads to the current consumption by the storage device 1110 or not. For example, when the command determination unit 311 determines that the host command H_CMD does not lead to the current consumption by the storage device 1110, the command determination unit 311 may output the advance signal NC to the command output unit 312. On the other hand, when the command determination unit 311 determines that the host command H_CMD leads to the current consumption by the storage device 1110, the command determination unit 311 may output the check signal YC to the operation check signal generation unit 313.

When the command output unit 312 receives the advance signal NC from the command determination unit 311, the command output unit 312 may generate and output the memory command M_CMD to the memory device 1100. Also, when the command output unit 312 receives the operation execution signal R_CHK from the current management unit 320, the command output unit 312 may generate and output the memory command M_CMD to the memory device 1100.

The operation check signal generation unit 313 may output the operation type signal OPT# and the operation state check signal CHK in response to the check signal YC provided from the command determination unit 311.

Figure 5:
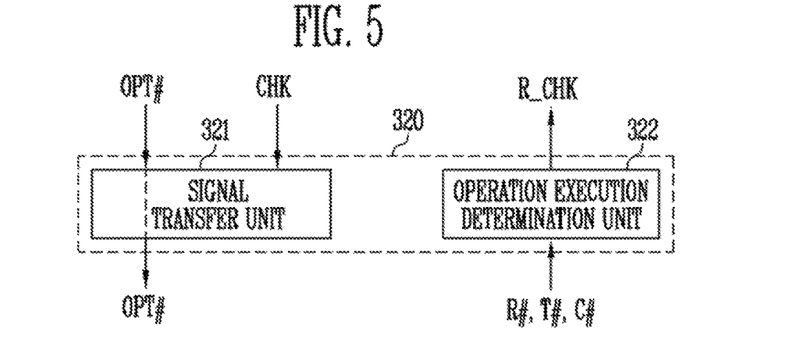
FIG. 5 illustrates an example of a current management unit shown in FIG. 3.

FIG. 5 illustrates an example of a current management unit 320 as shown in FIG. 3.

Referring to FIG. 5, the current management unit 320 may include a signal transfer unit 321 and an operation execution determination unit 322.

The signal transfer unit 321 may transfer the operation type signal OPT# from the operation check signal generation unit 313 to the current information storage unit 330 in response to the operation state check signal CHK provided from the operation check signal generation unit 313.

The operation execution determination unit 322 may output the operation execution signal R_CHK according to the determination of the stability of current based on the expected current amount R#, the allowable current amount T# and the currently-consumed current amount C# provided from the current information storage unit 330. As described above, when the expected current amount R# is less than the available current amount, which is the allowable current amount T# minus the currently-consumed current amount C#, the operation execution determination unit 322 may determine that the current consumption of the memory system 1000 is stable despite of the expected current consumption by the operation of the storage device 1110 for the host command H-CMD, and thus output the operation execution signal R_CHK. When the expected current amount R# is greater than the available current amount, the operation execution determination unit 322 may determine that the current consumption of the memory system 1000 is going to be unstable due to the expected current consumption by the operation of the storage device 1110 for the host command H-CMD, and thus delay output of the operation execution signal R_CHK.

Figure 6:
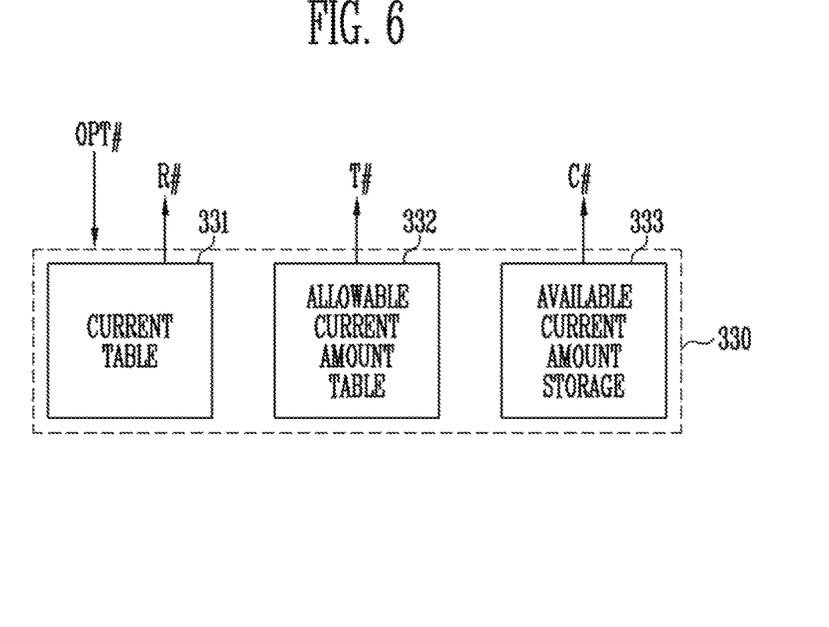
FIG. 6 illustrates an example of a current information storage unit shown in FIG. 3.

FIG. 6 illustrates an example of a current information storage unit 330 that may be used with the controller 1200a of FIG. 3. Referring to FIG. 6, the current information storage unit 330 may include an expected current amount table 331, an allowable current amount table 332 and a currently-consumed current amount storage 333.

The expected current amount table 331 may store the information about expected current amounts R# for various operations which may be performed by the storage device 1110 in response to various host commands H_CMD. Values of expected current amounts R# may be preset, for example at a manufacturing stage of the storage device 1110 or later through a test operation. For example, during a test operation, the amounts of electric current consumed to perform each operation may be set as the values of the expected current amounts R# after the storage device 1110 performs various operations for various host commands H_CMD. When the operation type signal OPT# is applied to the expected current amount table 331, the expected current amount R# corresponding to the operation type signal OPT# may be output from the expected current amount table 331.

The information about the allowable current amount T# may be stored in the allowable current amount table 332. A plurality of storage devices 1110 having different electric characteristics may be included in the memory device 1100 of the memory system 1000. Therefore, the maximum current amount of the memory system 1000 may vary depending on which storage devices 1110 are included in the memory system 1100. In addition, each of the plurality of storage devices 1110 may have various levels of maximum current amount according to a power management option of the memory system 1000, and thus the allowable current amount T# may be changed according to a selected power management option of the memory system 1000. For example, the memory system 1000 may have a lower power mode, a balance mode and a performance mode as possible power management options, and thus the allowable current amount T# may be changed according to the power management option selected. The allowable current amount T# may be set to be the lowest for the lower power mode, and may be set to an intermediate value between those for the lower power mode and the performance mode in the balance mode. In addition, the maximum power amount may be set to be the highest in the performance mode. In other words, when the operation type signal OPT# is applied to the allowable current amount table 332, the allowable current amount T# selected according to the power management option may be outputted from the allowable current amount table 332.

Figure 7:
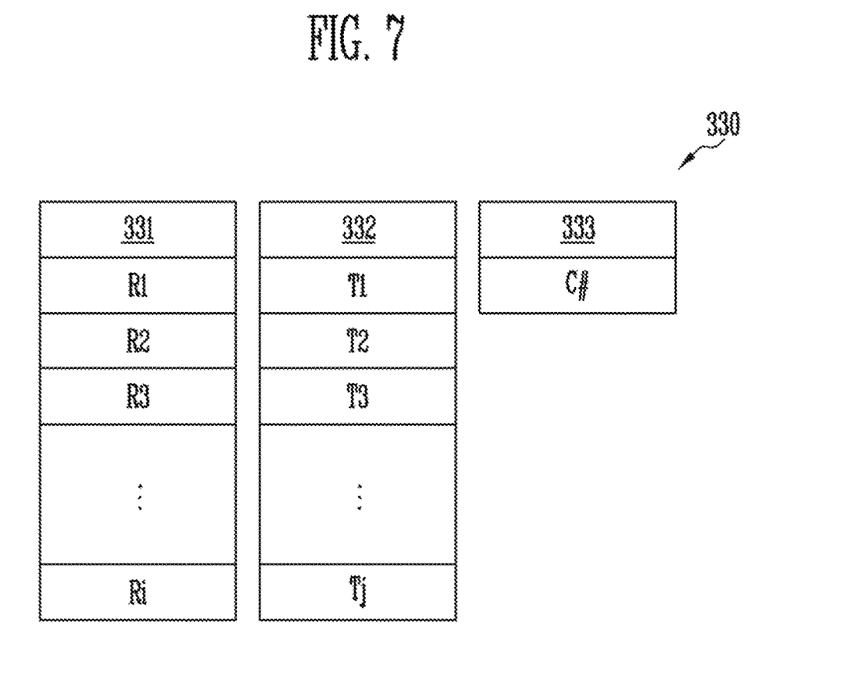
FIG. 7 illustrates an example of a current information storage unit shown in FIG. 6.

The information about the currently-consumed current amount C# may be stored in the currently-consumed current amount storage 333. For example, during operation of one or more of the storage devices 1110, the currently-consumed current amount of the memory system 1000 may be constantly changing according to the operation being performed. Therefore, the currently-consumed current amount C# stored in the currently-consumed current amount storage 333 may be constantly updated. When the operation type signal OPT# is applied to the currently-consumed current amount storage 333, the currently-consumed current amount C# may be outputted. FIG. 7 illustrates an example of a current information storage unit shown in FIG. 6

Referring to FIG. 7, an example of a current information storage unit 330 that may be used with the controller of shown in FIG. 6 is provided. Accordingly, information about expected current amounts R1 to Ri for the respective operations to be performed by a storage device 1110 for various host commands H_CMD, may be stored in an expected current amount table 331. As described above, the expected current amounts R1 to Ri of the respective operations may have preset values. When the operation type signal OPT# is applied to the expected current amount table 331, one of the information about the expected current amounts R1 to Ri may be outputted according to the operation type signal OPT#.

Information about allowable current amounts T1 to Tj may be stored in an allowable current amount table 332. As described above, information about various allowable current amounts T1 to Tj may be set taking into account individual electric characteristics of the plurality of storage devices 1110 and the power management option of the memory system 1000. When the operation type signal OPT# is applied to the allowable current amount table 332, one of the information about the allowable current amounts T1 to Tj may be output according to the operation type signal OPT# and the power management option of the memory system 1000.

The currently-consumed current amount storage 333 may be updated with the currently-consumed current amount C# of the memory system 1000. For example, the currently-consumed current amount storage 333 may be constantly updated with the information about the currently-consumed current amount C# of the memory system 1000. When the operation type signal OPT# is applied to the currently-consumed current amount storage 333, the last updated currently-consumed current amount C# may be outputted.

Figure 8:
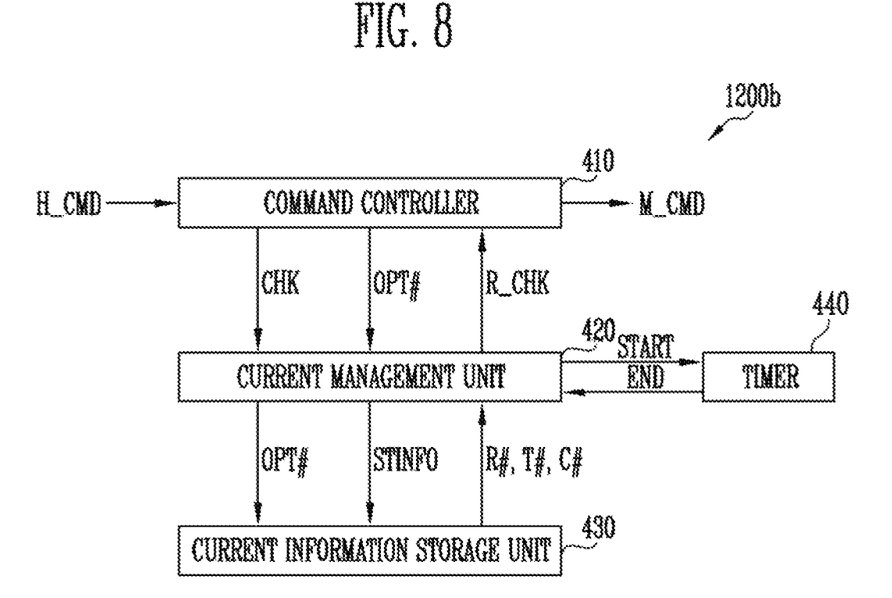
FIG. 8 illustrates a memory controller, according to another embodiment of the invention.

FIG. 8 illustrates a memory controller, according to another embodiment of the invention.

Referring to FIG. 8, a memory controller 1200b may include a command controller 410, a current management unit 420, a current information storage unit 430 and a timer 440. The command controller 410, the current management unit 420, and the current information storage unit 430 may be the same as the command controller 310, the current management unit 320, and the current information storage unit 330 described with reference to FIGS. 3 to 7 except for operations regarding a start signal START and an end signal END between the current management unit 420 and the timer 440 and a current amount information update signal STINFO between the current management unit 420 and the current information storage unit 430.

For example, the command controller 410 may determine whether the host command H_CMD leads to current consumption by the storage device 1110 or not. According to the result of the determination, the command controller 410 may output the memory command M_CMD, or the operation state check signal CHK and the operation type signal OPT# to adjust an output timing of the memory command M_CMD.

For example, when the command controller 410 determines that the host command H_CMD does not lead to current consumption by the storage device 1110, the command controller 410 may output the memory command M_CMD so that the selected storage device 1110 may perform an operation for the host command H_CMD. When the command controller 410 determines that the host command H_CMD leads to current consumption by the storage device 1110, the command controller 410 may output the operation state check signal CHK and the operation type signal OPT# to the current management unit 420, and may output the memory command M_CMD in response to an operation execution signal R_CHK provided from the current management unit 420.

The current management unit 420 may transfer the operation type signal OPT# from the command controller 310 to the current information storage unit 430 in response to the operation state check signal CHK, and may output the operation execution signal R_CHK according to the stability of current consumption. For determining the stability of current consumption, the current management unit 420 may receive information about an expected current amount R#, an allowable current amount T# and an currently-consumed current amount C# output from the current information storage unit 440. For example, the current management unit 420 may receive the information about the expected current amount R#, the allowable current amount T# and the currently-consumed current amount C#, and may output the operation execution signal R_CHK through determination of the stability of current consumption. The expected current amount R# may be the amount of electric current consumed by the storage device 1110 to perform the operation for the host command H_CMD. The allowable current amount T# may be the maximum amount of electric current for the memory system 1000 by which the memory device 1110 may perform operations without failure. The currently-consumed current amount C# may be the amount of electric current, which is currently consumed by the memory system 1000.

For example, when the expected current amount R# is less than an available current amount, which is the allowable current amount T# minus the currently-consumed current amount C#, the current management unit 420 may determine that the current consumption of the memory system 1000 is stable despite of the expected current consumption by the operation of the storage device 1110 for the host command H-CMD and thus output the operation execution signal R_CHK. When the expected current amount R# is greater than the available current amount, the current management unit 420 may determine that the current consumption of the memory system 1000 is going to be unstable due to the expected current consumption by the operation of the storage device 1110 for the host command H-CMD and thus may delay the output of the operation execution signal R_CHK.

In addition, whenever a predetermined operation of the storage device 1110 starts, the current management unit 420 may generate and output the start signal START to the timer 440. When the current management unit 420 receives an end signal END from the timer 440, the current management unit 420 may output the current amount information update signal STINFO to the current information storage unit 430. After the current management unit 420 outputs the current amount information update signal STINFO, the current management unit 420 may receive the updated currently-consumed current amount C# from the current information storage unit 430 and may output the operation execution signal R_CHK after a positive determination of the stability of current consumption.

The current information storage unit 440 may provide information about amounts of electric current for various operations in response to corresponding host commands H_CMD. The current information storage unit 440 may include storage units storing information about a current amount and provide the information about the current amount to the current management unit 420. For example, the current information storage unit 440 may include the storage units in which information about the expected current amount R#, the allowable current amount T#, and the currently-consumed current amount C# are stored, respectively. The current information storage unit 440 may provide the current management unit 420 with the information about the expected current amount R#, the allowable current amount T# and the currently-consumed current amount C# according to the operation type signal OPT#. Further, the current information storage unit 430 may update and output the currently-consumed current amount C# in response to the current amount information update signal STINFO.

When the current management unit 420 provides the timer 440 with the start signal START, the timer 440 may output the end signal END after a predetermined amount of time set for the predetermined operation of the storage device 1110 passes.

Figure 9:
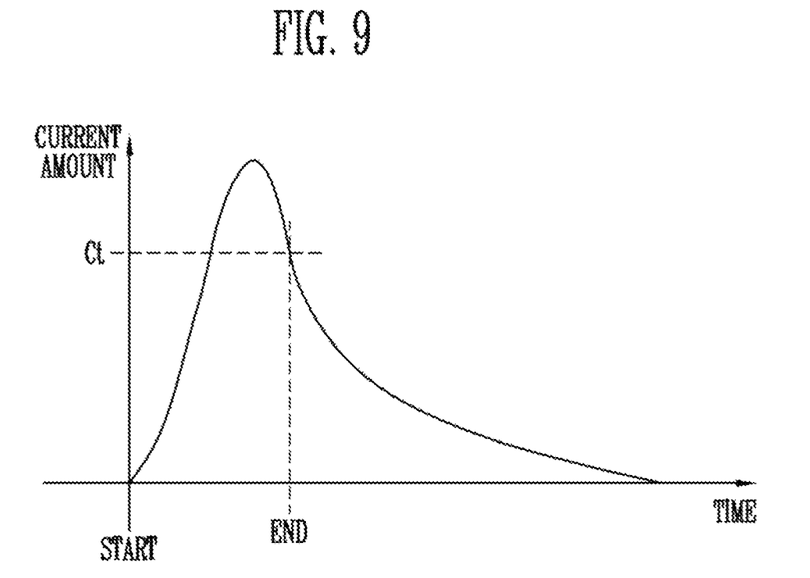
FIG. 9 illustrates example operations of a timer shown in FIG. 8.

FIG. 9 illustrates examples of operations of the timer 440 shown in FIG. 8.

Referring to FIG. 9, when a start signal START is applied as the detection result of the predetermined operation of the storage device 1110, the timer 440 may count a preset amount of time during which the amount of electric current consumed by the operation being performed by the storage device 1110 may decrease to less than a peak current amount Ct. When the preset amount of time elapses and thus the current amount consumed by the preselected operation of the storage device 1110 is less than the peak current amount Ct, the timer 440 may output the end signal END. The amounts of electric current consumed by the preselected operation of the storage device 1110 may be changed during performance of the preselected operation. This operating characteristic of the preselected operation of the storage device 1110 may be flexibly utilized by using the timer 440. For example, on the assumption that the amount of current consumed to perform the program operation for 100 us from its start point is 100, the amount of electric current consumed after 100 us from the program operation starts may be reduced to 20. According to this operating characteristic of the preselected operation of the storage device 1110, the timer 440 may account the preselected operation time (i.e., the 100 us of the example) from a time point at which the start signal START is applied, and may output the end signal END when the preselected operation amount of time passes and thus the current amount consumed by the preselected operation of the storage device 1110 is less than the peak current amount Ct (i.e., the value of "20" of the example).

Figure 10:
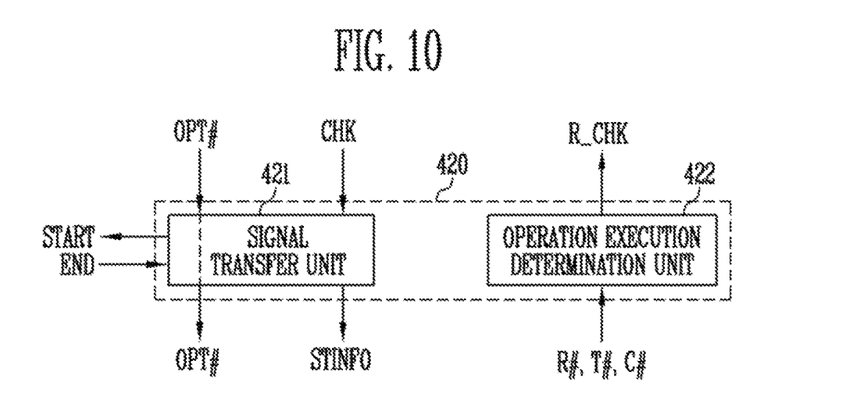
FIG. 10 illustrates an example of a time management unit shown in FIG. 8.

FIG. 10 illustrates an example of a time management unit shown in FIG. 8.

Referring to FIG. 10, a current management unit 420 may include a signal transfer unit 421 and an operation execution determination unit 422.

The signal transfer unit 421 may transfer the operation type signal OPT# from the command controller 410 to the current information storage unit 430 in response to the operation state check signal CHK provided from the command controller 410. In addition, whenever the storage device 1110 performs the preselected operation the signal transfer unit 421 may output the start signal START to the timer 440 and may output the current amount information update signal STINFO to the current information storage unit 430 in response to the end signal END output from the timer 440.

The operation execution determination unit 422 may output the operation execution signal R_CHK according to the determination of the stability of current based on the expected current amount R#, the allowable current amount T# and the currently-consumed current amount C# provided from the current information storage unit 440. As described above, when the expected current amount R# is less than the available current amount, which is the allowable current amount T# minus the currently-consumed current amount C#, the operation execution determination unit 422 may determine that the current consumption of the memory system 1000 is stable despite of the expected current consumption by the operation of the storage device 1110 for the host command H-CMD, and thus output the operation execution signal R_CHK. When the expected current amount R# is greater than the available current amount, the operation execution determination unit 422 may determine that the current consumption of the memory system 1000 is going to be unstable due to the expected current consumption by the operation of the storage device 1110 for the host command H-CMD, and thus may delay output of the operation execution signal R_CHK.

When the updated currently-consumed current amount C# is applied to the operation execution determination unit 422 in response to the current amount information update signal STINFO, the operation execution determination unit 422 may determine the stability of current based on the expected current amount R#, the allowable current amount T# and the updated currently-consumed current amount C#. As a result of the re-determination, when the expected current amount R# is less than the updated available current amount, the operation execution determination unit 422 may output the operation execution signal R_CHK. The operation execution determination unit 422 may not output the operation execution signal R_CHK until the expected current amount R# is less than the updated available current amount. The operation execution determination unit 422 may output the operation execution signal R_CHK when the expected current amount R# is less than the updated available current amount.

Figure 11:
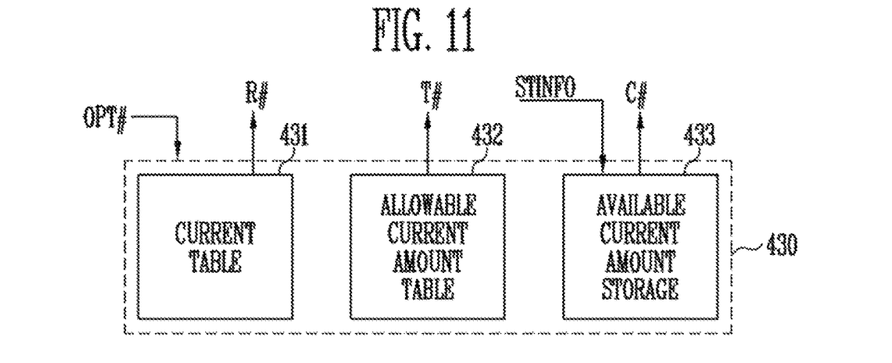
FIG. 11 illustrates an example of a current information storage unit shown in FIG. 8.

FIG. 11 illustrates an example of a current information storage unit shown in FIG. 8.

Referring to FIG. 11, a current information storage unit 430 may include an expected current amount table 431, an allowable current amount table 432 and a currently-consumed current amount storage 433. The expected current amount table 431 and the allowable current amount table 432 are the same as the expected current amount table 331 and the allowable current amount table 332 described with reference to FIG. 6. The currently-consumed current amount storage 433 is similar to the currently-consumed current amount storage 333 described with reference to FIG. 6. The current information unit 430 of FIG. 11 may in addition, when the current amount information update signal STINFO is applied to the currently-consumed current amount storage 433, the currently-consumed current amount storage 433 may update and output the currently-consumed current amount C# in response to the current amount information update signal STINFO.

Figure 12:
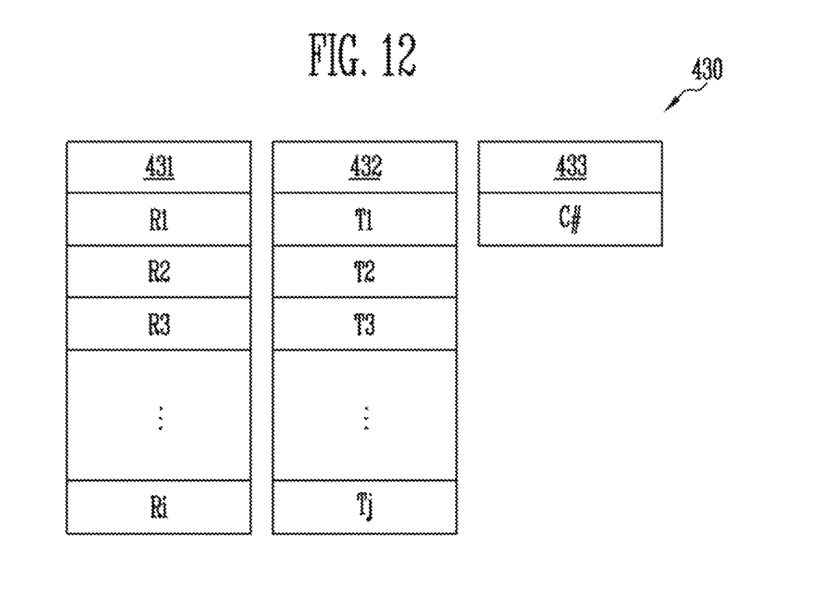
FIG. 12 illustrates an example of a current information storage unit shown in FIG. 11.

FIG. 12 illustrates an example of a current information storage unit shown in FIG. 11.

Referring to FIG. 12, the current information storage unit 430 may be the same as the current information storage unit 330 described with reference to FIG. 7, however, it may have an additional feature. For example, when the current amount information update signal STINFO is applied to the currently-consumed current amount storage 433, the currently-consumed current amount storage 433 may update and output the currently-consumed current amount C# in response to the current amount information update signal STINFO. For example, on the assumption that a first currently-consumed current amount C# is output in response to the operation type signal OPT#, the currently-consumed current amount storage 333 may be updated with a second currently-consumed current amount C# in response to the current amount information update signal STINFO. Since the current amount information update signal STINFO may be updated frequently, the currently-consumed current amount storage 433 may frequently update and output the currently-consumed current amount C#.

Figure 13:
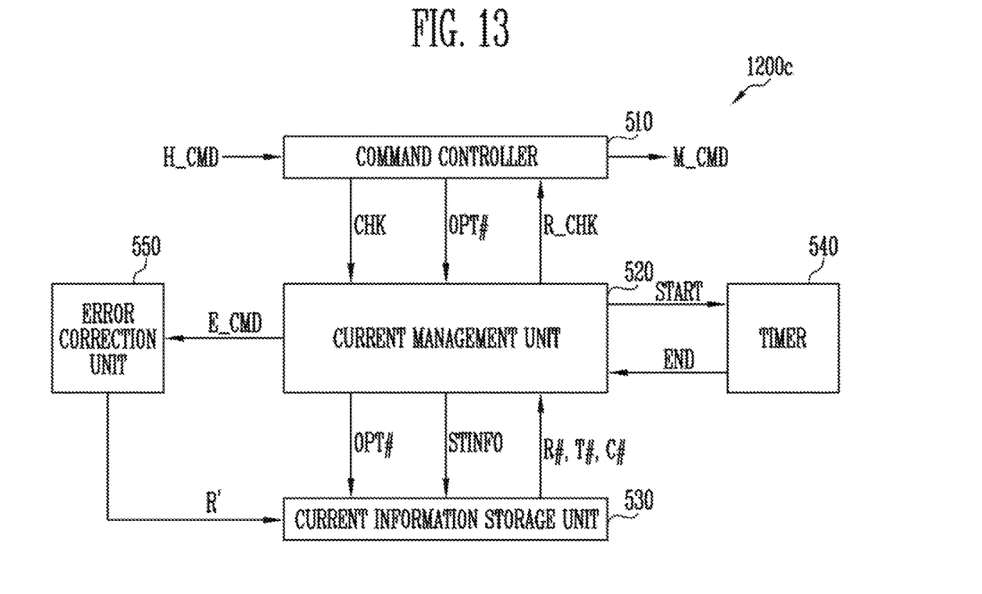
FIG. 13 illustrates a memory controller, according to another embodiment of the invention.

FIG. 13 illustrates a memory controller, according to another embodiment of the invention.

Referring to FIG. 13, a memory controller 1200c may include a command controller 510, a current management unit 520, a current information storage unit 530, a timer 540 and an error correction unit 550. The error correction unit 550 is an example of a device which consumes a large amount of electric current other than the memory device 1100. The command controller 510, the current management unit 520, the current information storage unit 530, and the timer 540 may be the same as the command controller 410, the current management unit 420, the current information storage unit 430, and the timer 440 described with reference to FIGS. 8 to 12 except for operations regarding a monitoring command E_CMD between the current management unit 520 and the error correction unit 550 and an expected current amount R' of the error correction unit 550 between the current information storage unit 530 and the error correction unit 550.

When an error correction operation of the error correction unit 550 is required in response to the operation type signal OPT#, the current management unit 520 may output the monitoring command E_CMD to the error correction unit 550 to monitor the current consumption of the error correction unit 550.

The error correction unit 550 may perform an error correction operation to ensure the reliability of the storage device 1110. The error correction unit 550 may output the expected current amount R' thereof to the current information storage unit 530 in response to the monitoring command E_CMD.

The current information storage unit 530 may transfer the expected current amount R' of the error correction unit 550 to the current management unit 520 for the determination of the stability of current consumption in case that the host command H_CMD requires the error correction operation of the error correction unit 550.

Figure 14:
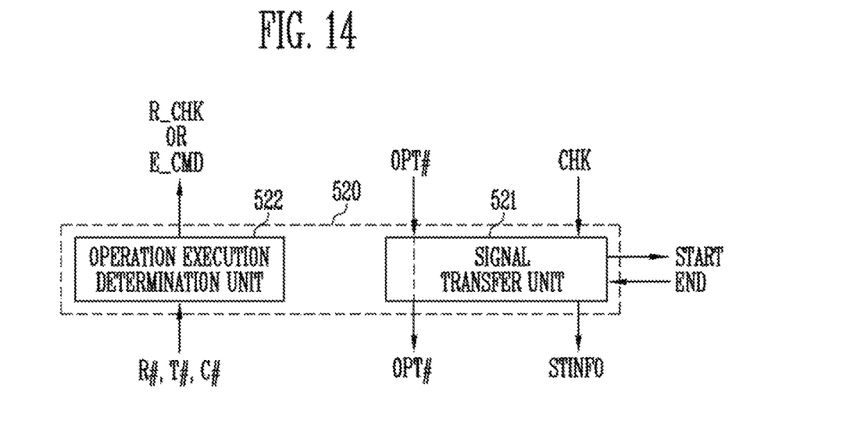
FIG. 14 illustrates an example of a current management unit shown in FIG. 11.

FIG. 14 illustrates an example of a current management unit shown in FIG. 11.

Referring to FIG. 14, a current management unit 520 may include a signal transfer unit 521 and an operation execution determination unit 522.

The signal transfer unit 521 may transfer the operation type signal OPT# from the current information storage unit 530 to the command controller 510 in response to the operation state check signal CHK provided from the command controller 510. In addition, whenever the storage device 1110 performs the preselected operation the signal transfer unit 521 may output the start signal START to the timer 540 and may output the current amount information update signal STINFO to the current information storage unit 530 in response to the end signal END output from the timer 540. In addition, the signal transfer unit 521 may output the monitoring command E_CMD to the error correction unit 550 in response to the operation state check signal CHK in order to reflect the expected current amount R' of the error correction unit 550 into the determination of the stability of current consumption in case that the host command H_CMD requires the error correction operation of the error correction unit 550. The error correction unit 550 may output the expected current amount R' thereof to the current information storage unit 530 in response to the monitoring command E_CMD. The current information storage unit 530 may transfer the expected current amount R' of the error correction unit 550 to the current management unit 520 for the determination of the stability of current consumption in case that the host command H_CMD requires the error correction operation of the error correction unit 550.

The operation execution determination unit 522 may output the operation execution signal R_CHK according to the determination of the stability of current based on the expected current amount R#, the allowable current amount T# and the currently-consumed current amount C# provided from the current information storage unit 550. As described above, when the expected current amount R# is less than the available current amount, which is the allowable current amount T# minus the currently-consumed current amount C#, the operation execution determination unit 522 may determine that the current consumption of the memory system 1000 is stable despite of the expected current consumption by the operation of one or more of the storage device 1110 and the error correction unit 550 for the host command H-CMD, and thus output the operation execution signal R_CHK. When the expected current amount R# is greater than the available current amount, the operation execution determination unit 522 may determine that the current consumption of the memory system 1000 is going to be unstable due to the expected current consumption by the operation of one or more of the storage device 1110 and the error correction unit 550 for the host command H-CMD, and thus delay output of the operation execution signal R_CHK.

For example, when the expected current amount R' of the error correction unit 550 is greater than the available current amount, the operation execution determination unit 422 may determine that the current consumption of the memory system 1000 is going to be unstable due to the expected current consumption by the operation of the error correction unit 550 for the host command H-CMD, and thus delay and output the operation execution signal R_CHK to the storage device 1110, so that the operation of the storage device 1110 may be delayed. As a result, the error correction operation of the error correction unit 550 may be delayed as much as delay time of the storage device 1110. Thus, a surge in the current amount of the error correction unit 550 may be prevented.

Figure 15:
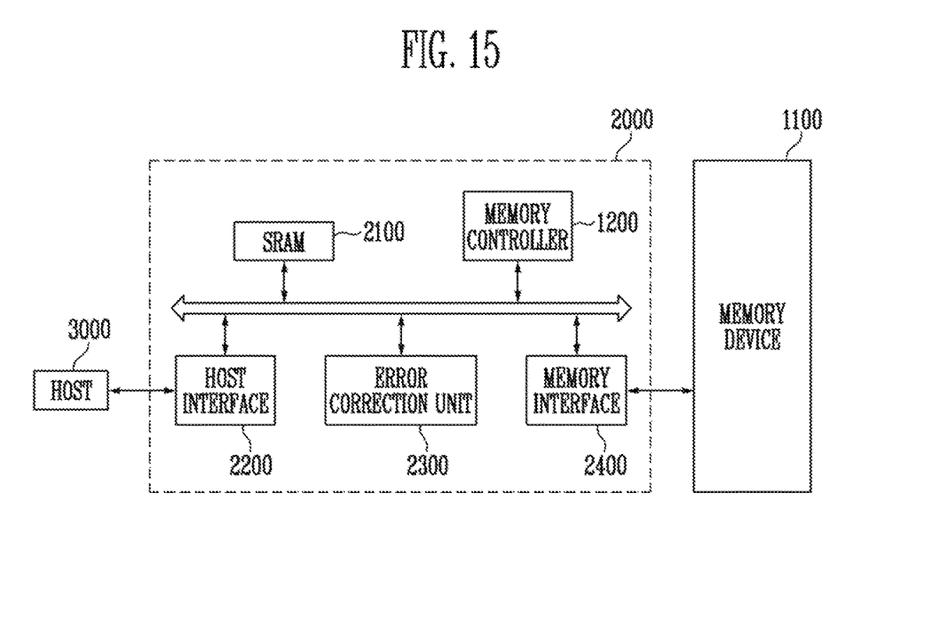
FIG. 15 illustrates a memory system, according to another embodiment of the invention.

FIG. 15 illustrates a memory system, according to another embodiment of the invention.

Referring to FIG. 15, the memory system, according to another embodiment, may include the memory device 1100, a controller 2000 and a host 3000.

The controller 2000 may include the memory controller 1200, SRAM 2100, a host interface 2200, an error correction unit 2300 and a memory interface 2400.

The memory controller 1200 may control the semiconductor device 1100. The SRAM 2100 may be used as a working memory of the memory controller 100. The host interface 2200 may include a data exchange protocol of the host 3000 electrically coupled with the controller 2000. The error correction circuit 2300 may detect and correct errors in data read from the semiconductor device 1100. The memory interface 2400 may interface with the semiconductor device 1100. The memory controller 1200 may perform a control operation for data exchange between the controller 2000 and the memory device 1100. In addition, although not illustrated in FIG. 15, a read only memory (ROM) (not shown) for storing code data for interfacing with the host 3000 may be provided in the controller 2000.

The memory system may be applied to one of a computer, an ultra mobile PC (UMPC), a workstation, a net-book, a PDA, a portable computer, a web tablet, a wireless phone, a mobile phone, a smartphone, a digital camera, a digital audio recorder, a digital audio player, a digital picture recorder, a digital picture player, a digital video recorder, a digital video player, a device of transmitting and receiving information in a wireless environment, various devices constituting a home network and the like.

Figure 16:
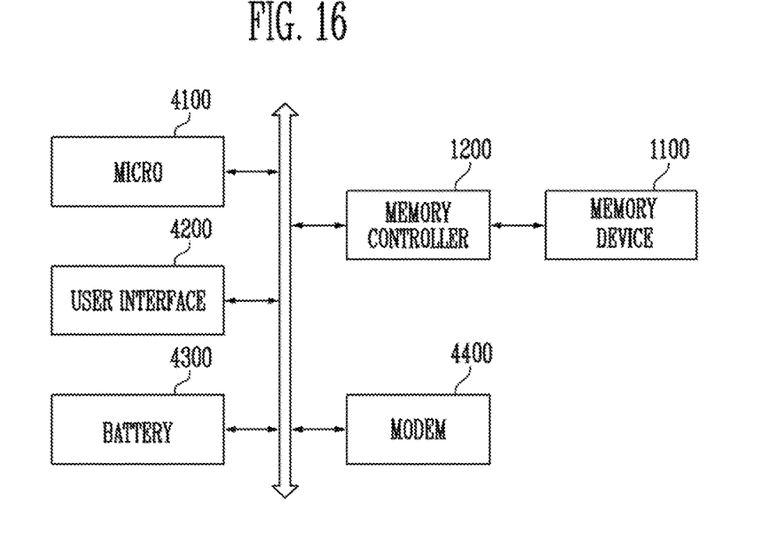
FIG. 16 illustrates a memory system, according to yet another embodiment of the invention.

FIG. 16 illustrates a memory system according to yet another embodiment of the invention. Referring to FIG. 16, a memory system according to this embodiment may include the memory device 1100, the memory controller 1200, MICRO 4100, and a user interface 4200 which are electrically connected to a bus. When the memory system is a mobile device, a battery 4300 may be additionally provided to supply operating voltages of the memory system. Though not shown in FIG. 16, the memory system may further include other devices such as, for example, an application chip set, a camera image processor (CIS) and mobile DRAM.

The memory controller 1200 and the memory device 1100 may form a Solid State Drive/Disk (SSD).

The memory device 1100 and the memory controller 1200 may be mounted using various types of packages. For example, the memory device 1100 and the memory controller 1200 may be mounted using packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), wafer-level processed stack package (WSP), and the like.

According to the embodiments described, a memory controller, a memory system, and a method of operation thereof are provided that allow controlling operations of a memory device having multiple storage devices by managing current consumption to prevent erroneous operation of the memory system caused by a shortage of electric current may be prevented. Hence, the present invention provide a more reliable memory system.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A memory controller for controlling a memory device of a memory system, the memory controller comprising:
    a current management unit configured to control an output time of an operation execution signal by determining stability of current consumption of the memory system; and
    a command controller configured to control the memory device of the memory system to perform an operation in response to a host command, receive the operation execution signal from the current management unit, and output a command to operate the memory device in response to the operation execution signal,
    wherein the command controller outputs the command to operate the memory device immediately in response to a determination that the operation to be performed in response to the host command does not require current consumption by the memory device.

2. The memory controller of claim 1, further comprising a current information storage unit configured to store information about current amounts of the memory system; wherein the current management unit determines stability of current consumption of the memory system based on the information about current amounts of the memory system stored in the current information storage unit.

3. The memory controller of claim 2, wherein the current information storage unit stores information about an expected current amount consumed through the operation to be performed by the memory device in response to the host command, information about an allowable current amount of the memory system, and information about a currently-consumed current amount of the memory system.

4. The memory controller of claim 3, wherein the allowable current amount includes a plurality of maximum current amounts according to a power management option of the memory system.

5. The memory controller of claim 4, wherein the power management option includes a lower power mode in which a maximum power amount is set to be the lowest, a balance mode in which a maximum power amount is set to be higher than in the lower power mode, and a performance mode in which a maximum power amount is set to be the highest.

6. The memory controller of claim 3, wherein the current management unit determines the stability of current consumption by comparing the expected current amount and an available current amount, which is the allowable current amount minus the currently-consumed current amount.

7. The memory controller of claim 3, wherein the currently-consumed current amount is constantly updated according to an operation of the memory system.

8. The memory controller of claim 6,
wherein the current management unit outputs the operation execution signal to the command controller when the expected current amount is less than the available current amount, and
wherein the current management unit delays the output of the operation execution signal when the expected current amount is greater than the available current amount.

9. The memory controller of claim 2, further comprising a timer counting a preset amount of time during which an amount of electric current consumed by an operation being performed by a storage device is decreased to less than a peak current amount when a start signal is applied from the current management unit, and outputting an end signal to the current management unit.

10. The memory controller of claim 9, wherein the timer outputs the end signal when the preset amount of time elapses and thus the current amount consumed by a preselected operation of the storage device is less than the peak current amount.

11. The memory controller of claim 2, further comprising an error correction unit configured to perform an error correction operation to the memory device, and output an expected current amount for the error correction operation to the current information storage unit when the host command requires the error correction operation.

12. The memory controller of claim 1, wherein the command controller determines whether or not the operation to be performed in response to the host command requires current consumption by the memory device before outputting the command immediately.

13. A memory controller comprising:
a current information storage unit configured to store information about current amounts of a memory system;
a command controller configured to output an operation type signal and an operation state check signal in response to a host command; and
a current management unit configured to transfer the operation type signal to the current information storage unit in response to the operation state check signal, and output an operation execution signal to the command controller by determining stability of current consumption of the memory system based on the information about the current amounts,
wherein the current information storage unit provides the current management unit with the information about the current amounts in response to the operation type signal.

14. The memory controller of claim 13, wherein the command controller outputs a memory command to operate a memory device of the memory system in response to the operation execution signal.

15. The memory controller of claim 13, wherein the current management unit comprises:
a signal transfer unit transferring the operation type signal to the current information storage unit in response to the operation state check signal; and
an operation execution determination unit outputting the operation execution signal by determining the stability of current consumption.

16. The memory controller of claim 13, wherein the current information storage unit comprises:
an expected current amount table configured to store information about an expected current amount consumed through an operation to be performed by the memory device in response to the host command;
an allowable current amount table configured to store information about an allowable current amount of the memory system; and
a currently-consumed current amount storage configured to store information about a currently-consumed current amount of the memory system.

17. The memory controller of claim 13, further comprising a timer counting a preset amount of time during which an amount of electric current consumed by an operation being performed by the storage device is decreased to less than a peak current amount in response to a start signal output from the current management unit, and outputting an end signal to the current management unit.

18. The memory controller of claim 13, further comprising an error correction unit configured to perform an error correction operation to a memory device of the memory system, and output an expected current amount thereof to the current information storage unit when the host command requires the error correction operation.

19. A memory system, comprising:
a memory device; and
a memory controller configured to control the memory device to perform an operation in response to a host command,
wherein the memory controller outputs a memory command to operate the memory device by determining stability of current consumption of the memory system based on an expected current amount of the operation of the memory device in response to the host command, information about an allowable current amount of the memory system and information about a currently-consumed current amount of the memory system, and
wherein the command controller determines whether or not the operation to be performed in response to the host command requires current consumption by the memory device, and outputs the memory command to operate the memory device immediately when the operation to be performed in response to the host command does not require current consumption by the memory device.

20. The memory system of claim 19, wherein the memory controller comprises:
a current information storage unit configured to store the information about the expected current amount, the information about the allowable current amount and the information about the currently-consumed current amount;

a current management unit configured to control an output time of an operation execution signal by determining stability of current consumption of the memory system; and a command controller configured to output the memory command in response to the operation execution signal.

21. The memory system of claim 20, wherein the current management unit outputs the operation execution signal to the command controller when the expected current amount is less than an available current amount, which is the allowable current amount minus the currently-consumed current amount, and wherein the current management unit delays the output of the operation execution signal when the expected current amount is greater than the available current amount.

22. The memory system of claim 19, wherein the allowable current amount includes maximum current amounts of the memory system according to a power management option of the memory system.

* * * * *